to be approximately equal to an external reference voltage. The settings obtained during calibration are stored in a programmable memory on the programmable transistor device.

United States Patent [19]
Wong

[11] Patent Number: 5,790,469
[45] Date of Patent: Aug. 4, 1998

[54] PROGRAMMABLE VOLTAGE SUPPLY CIRCUITRY

[75] Inventor: Myron Wai Wong, San Jose, Calif.

[73] Assignee: Altera Corporation, San Jose, Calif.

[21] Appl. No.: 899,714

[22] Filed: Jul. 23, 1997

Related U.S. Application Data

[62] Division of Ser. No. 634,508, Apr. 18, 1996, Pat. No. 5,699,312.

[51] Int. Cl.$^6$ ................................................ G11C 13/00
[52] U.S. Cl. ............................................. 365/226; 365/227
[58] Field of Search ...................................... 365/226, 227

[56] References Cited

U.S. PATENT DOCUMENTS 3,971,055 7/1976 Arai ............................................ 365/45
5,177,705 1/1993 McElroy et al. .
5,371,422 12/1994 Patel et al. .

OTHER PUBLICATIONS

H. Bleeker et al., *Boundary–Scan Test; A Practical Approach*, Kluwer Academic Publishers, Dordrecht, 1993, p. 21.

"IEEE Standard Test Access Port and Boundary–Scan Architecture," IEEE Std 1149.1–1990 (Includes IEEE Std 1149.1a–1993), Institute of Electrical and Electronics Engineers, Inc., New York, N.Y., Oct. 21, 1993.

"FLEXlogic Application Support Manual, A Collection of Application Notes," Intel Corporation, Dec. 1993.

C. Brown, "Overview of In–Circuit Reconfiguration and Reprogramming for the FLEXlogic iFX8160," Intel Corporation, Mar. 1994.

Lattice In–System Programmability Manual 1994, Lattice Semiconductor Corporation.

Lattice Handbook 1994, Lattice Semiconductor Corporation.

*Primary Examiner*—Terrell W. Fears
*Attorney, Agent, or Firm*—Fish & Neave; Robert R. Jackson; G. Victor Treyz

[57] ABSTRACT

Internal programmable voltage supply circuitry is provided for a programmable transistor integrated circuit device, such as a programmable logic device or a programmable memory device. The programmable voltage supply circuitry generates a programming voltage that is used to program the configuration of the programmable transistor device. The programmable voltage supply circuitry is calibrated by adjusting the programming voltage that is produced by the programming voltage supply circuitry to be approximately equal to an external reference voltage. The settings obtained during calibration are stored in a programmable memory on the programmable transistor device.

10 Claims, 2 Drawing Sheets

PROGRAMMABLE VOLTAGE SUPPLY CIRCUITRY

This is a divisional of application Ser. No. 08/634,508, filed Apr. 18, 1996 entitled PROGRAMMABLE VOLTAGE SUPPLY CIRCUITRY now U.S. Pat. No. 5,699,312.

BACKGROUND OF THE INVENTION

This invention relates to programmable transistor integrated circuit devices, and more particularly, to internal voltage supply circuits for programming such programmable devices.

Programmable transistor devices are widely used by designers of complicated electronic systems. Programmable transistor devices are popular because they are more flexible than standard integrated circuits. In general, the user who incorporates a programmable transistor device into a system determines the configuration of the device, rather than the original manufacturer of the device.

A variety of programmable transistor devices are available. Non-volatile programmable transistor devices include programmable logic devices and read-only memories employing erasable programmable read-only memory (EPROM) transistors, electrically-erasable programmable read-only memory (EEPROM) transistors, and flash transistors. The user programs these devices by applying a suitable programming voltage to selected programmable transistors on the device. Applying the programming voltage changes the state of the selected transistors by injecting charge onto the transistors' floating gates. When charge is present on the floating gate of a transistor, the transistor will not switch, whereas, when no charge is present on the floating gate, the transistor will switch normally.

The magnitude of the programming voltage must be carefully controlled. If the programming voltage is too low, the programmable transistors might not be programmed properly. However, if the programming voltage is too high, the transistors could be damaged. Transistor damage is a particular concern for transistors formed using advanced fabrication processes. The smaller transistor geometries encountered with such processes make the transistors more susceptible to gate oxide and junction damage from an improperly controlled programming voltage than transistors fabricated with less advanced techniques.

Some programmable transistors devices are programmed in an unassembled state using a tool known as a "programmer." Programmers generate programming voltages externally (off-chip). Other programmable transistor devices are programmed after they have been assembled with other components, for example, by mounting on a printed circuit board. This approach, which is called in-system programming, allows devices to be programmed at a very late stage in the process of assembling the devices into a system, which allows last-minute design changes to be accommodated. In-system programming also reduces the handling of programmable parts, which reduces the likelihood of damage.

However, programmable transistor devices suitable for in-system programming generally have internal (on-chip) circuits for generating the programming voltage. The programming voltages produced by such internal circuits can vary considerably because the internal circuits are subject to process variations that arise during fabrication. One way to reduce the variation in the programming voltages produced by internal supply circuits would be to provide conventional voltage regulating circuitry on the programmable device to ensure that the programming voltage generated by the internal supply circuit is maintained at the proper magnitude. For example, a voltage clamp circuit based on the known voltage breakdown characteristic of a diode junction could be used. However, on a typical integrated circuit, only certain types of junction are available, which limits the range of voltages for which a voltage clamp circuit can be provided. In addition, the known junction breakdown voltage in the voltage clamp circuit would itself be subject to process-induced variations. As a result, what is needed is an approach for providing an accurate internally generated programming voltage without using conventional voltage regulating circuitry.

It is therefore an object of the present invention to provide improved circuitry for internally generating the programming voltage for a programmable transistor device.

It is another object of the present invention to provide an internal voltage supply circuit that allows the magnitude of the programming voltage to be calibrated by a manufacturer before a user programs the device.

SUMMARY OF THE INVENTION

These and other objects of the invention are accomplished in accordance with the principles of the present invention by providing internal programmable voltage supply circuitry for use in a programmable transistor device, such as a programmable logic device or a programmable memory device. The programmable voltage supply circuitry generates a programming voltage that can be used to inject charge onto the floating gates of programmable transistors in programmable transistor devices. Because the voltage supply circuit is internal (on-chip), programmable transistor devices using the voltage supply circuitry are suitable for applications requiring in-system programming.

The programmable voltage supply circuitry is adjustable, so that the manufacturer can calibrate the magnitude of the programming voltage produced by the supply circuitry. The calibration process involves adjusting the programming voltage until it is equal to an external reference voltage. Settings obtained during calibration are stored in a programmable memory on the programmable device. The calibration step ensures that the programming voltage is set to a level that is neither too high nor too low. In contrast to non-adjustable voltage regulation schemes, the programming voltage produced by the programmable voltage supply circuitry can be adjusted to compensate for process variations that affect the voltage supply circuitry and the circuitry of the programmable transistor device in general.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
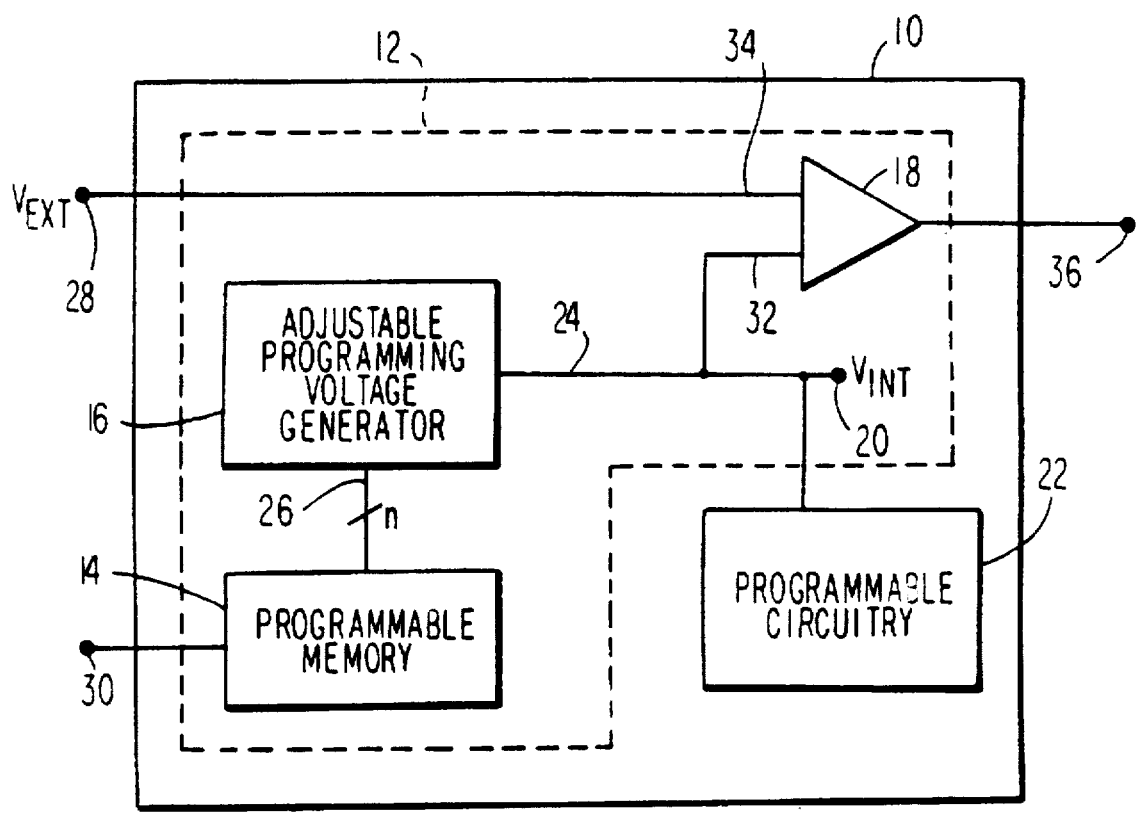
FIG. 1 is a circuit diagram of programmable voltage supply circuitry in accordance with the present invention.

Programmable transistor integrated circuit device 10, which may be a programmable logic device or programmable memory device, is shown in FIG. 1. Programmable voltage supply circuitry 12 preferably includes programmable memory 14, adjustable programming voltage generator 16, and comparator 18. Programmable voltage supply circuitry 12 is an internal voltage source, because programmable voltage supply circuitry 12 is formed on-chip, as part of programmable device 10. Programmable voltage supply circuitry 12 preferably provides a programming voltage $V_{INT}$ of approximately 13 V, at output 20.

The voltage $V_{INT}$ is used to program the transistors in programmable circuitry 22. For example, if programmable circuitry 22 is based on EPROM transistors, the programming voltage $V_{INT}$ is used to inject charge onto the floating gates of selected programmable transistors, thereby configuring the programmable circuitry 22. The magnitude of the programming voltage is significantly larger than a standard power supply voltage of 5 V, because the voltage required to inject charge onto the floating gates is much larger than the voltage used to bias typical digital circuits. Because the voltage $V_{INT}$ is internally generated, the arrangement of FIG. 1 can be used for in-system programming.

Preferably, during an initial calibration step, the manufacturer adjusts the programming voltage $V_{INT}$ that is supplied by adjustable programming voltage generator 16 to the proper magnitude for programming. Following calibration, the user can install programmable device 10 in a system, for example, by mounting programmable device 10 on a printed circuit board. To configure programmable device 10, the programming voltage $V_{INT}$ is applied to selected programmable transistors within programmable circuitry 22 using conventional programming techniques.

The voltage $V_{INT}$ at output 20 is supplied to output 24 by adjustable programming voltage generator 16. The magnitude of the voltage $V_{INT}$ is preferably determined by voltage level control signals applied to input 26 of adjustable programming voltage generator 16. The voltage level control signals are stored in programmable memory 14, which preferably contains a relatively small number of memory cells formed from part of a larger programmable memory block. For example, programmable memory 14 may be made up of nine programmable cells of a 64 kilobit memory used to provide the programmable transistors for programmable circuitry 22.

During calibration, a reference voltage $V_{EXT}$ having a magnitude equal to the desired programming voltage is applied to input terminal 28 of programmable device 10. The voltage $V_{EXT}$ is preferably generated by an accurate external source, such as a conventional programmer. While the voltage $V_{EXT}$ is applied to terminal 28, the voltage level control signals applied at input 26 of adjustable programming voltage generator 16 are varied to adjust the voltage generated at output 24. If desired, the voltage level control signals can be varied directly by the programmer (using an input line connected to input 26) and subsequently stored in programmable memory 14. Preferably, the voltage level control signals are varied by programming programmable memory 14 via programmable memory input 30 using conventional programming techniques.

Comparator 18, which is preferably formed as part of programmable device 10, but which could alternatively be an external component, compares the voltage $V_{INT}$ received at input 32 with the reference voltage $V_{EXT}$ received at input 34. Comparator 18 provides a digital output signal at output 36 that is indicative of the relative magnitudes of the voltages $V_{INT}$ and $V_{EXT}$. A typical calibration procedure involves applying a voltage $V_{EXT}$ of 13 V to input terminal 28 while linearly ramping up the voltage $V_{INT}$ until the polarity of the output signal at output 36 changes, indicating that the magnitude of $V_{INT}$ has been successfully adjusted to be equal to $V_{EXT}$.

Following calibration by the manufacturer, the values of the voltage level control signals used to direct adjustable programming voltage generator 16 to produce the desired programming voltage remain stored in programmable memory 14. Although programmable memory 14 could be formed using any suitable storage technology, including random-access memory (RAM), fusible links, or antifuses, programmable memory 14 is preferably non-volatile circuitry formed using the same technology used to form programmable circuitry 22. When the user desires to configure programmable circuitry 22 using in-system programming, the voltage $V_{INT}$, calibrated to the proper magnitude, is provided at terminal 20.

Figure 2:
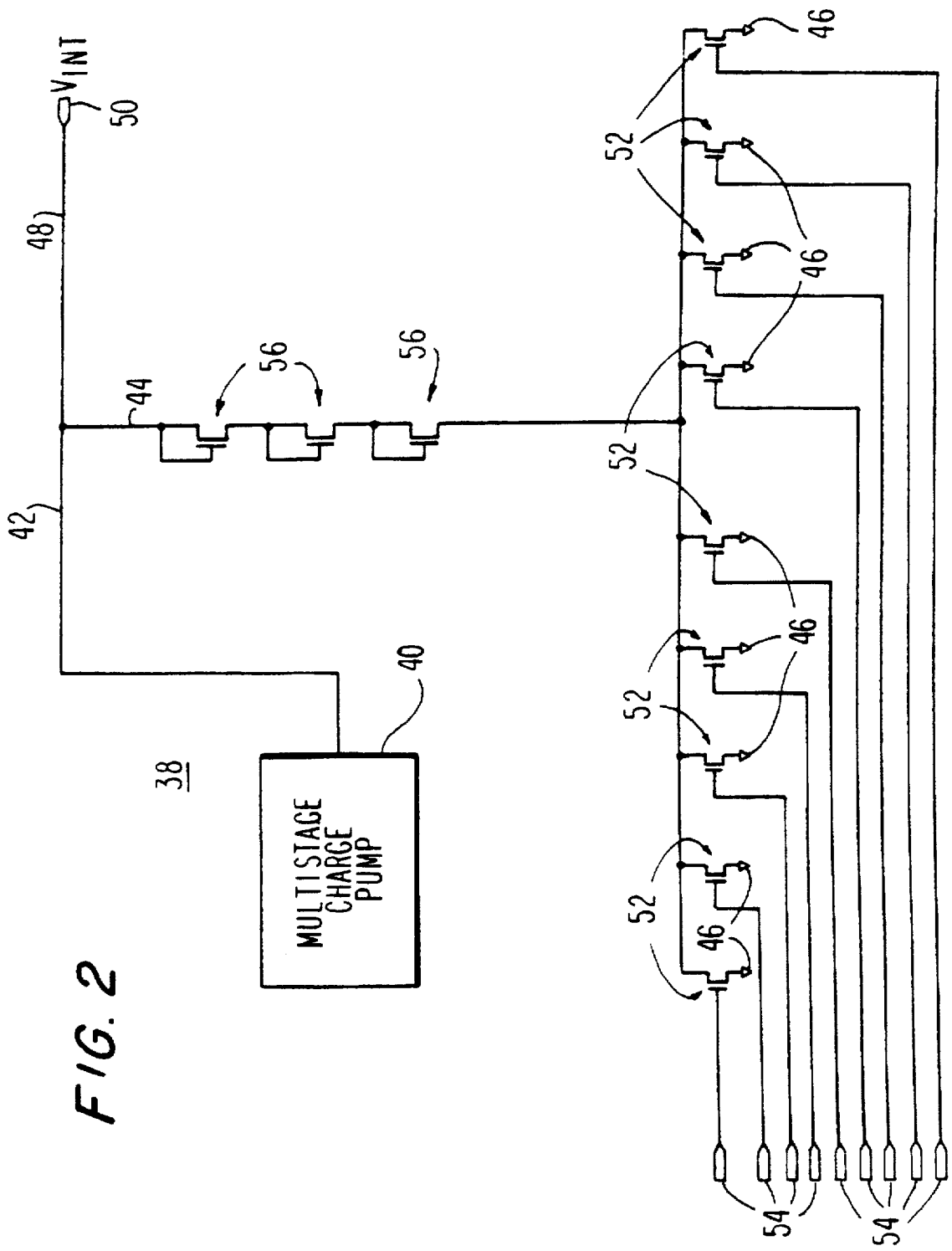
FIG. 2 is a circuit diagram of an adjustable programming voltage generator for use in the programmable voltage supply circuitry of FIG. 1.

FIG. 2 shows circuitry for implementing adjustable programming voltage generator 16 of FIG. 1. Adjustable programming voltage generator 38 has multistage charge pump 40. Each stage of multistage charge pump 40 has a capacitor and an isolating transistor. The stages are connected in series. Multistage charge pump 40 preferably generates voltages that are nominally in the range of 9 V to 15 V. Multistage charge pump 40 has an internal resistance that increases non-linearly as the current drawn via line 42 is increased. As a result, the voltage supplied by multistage charge pump 40 can be adjusted by controlling the amount of current that flows from line 42 through line 44 to ground potential 46. When no current flows through line 42, the voltage drop across the internal resistance in multistage charge pump 40 is zero and the voltage output from multistage charge pump 40 on line 42 is 15 V. When a relatively large current, e.g., 600 µA, is drawn through line 42, the voltage supplied by multistage charge pump 40 is 9 V. The magnitude of the current drawn through line 48 is generally small, but is dependent on process variations. The magnitude of the current drawn through line 44 is therefore preferably adjusted to compensate for the effect of the current though line 48 on the voltage $V_{INT}$ supplied at output 50.

Specifically, the magnitude of the voltage $V_{INT}$ provided at output 50 is adjusted during calibration by turning on as many of transistors 52 as are needed to draw the desired magnitude of current though line 44. Control lines 54 are used to supply the voltage level control signals stored in programmable memory 14 (FIG. 1) to transistors 52. If a given control line 54 is high, the corresponding transistor 52 will be on and will draw a predetermined current (e.g., approximately 65 µA).

When all control lines 54 are held high, all transistors 52 will be turned on, and a maximum current will be drawn through line 44. In this situation, the voltage supplied by multistage charge pump 40 will be at a minimum level. When all control lines 54 are held low, all transistors 52 will be off, and no current will be drawn though line 44. In this situation, the voltage supplied by multistage charge pump 40 will be at a maximum level. Turning on a given transistor 52 preferably results in a decrease in the voltage level at output 50 of approximately 0.6 V. Diode-configured transistors 56 are preferably capable of handling high voltages and are provided to limit the current through line 44, thereby protecting the circuitry of adjustable programming voltage generator 38.

Preferably, calibration involves initially turning on all transistors 52, so that the voltage $V_{INT}$ provided at output 50 is at its minimum level. The voltage $V_{INT}$ may then be ramped up by turning off a progressively increasing number of transistors 52. When the signal at output 36 of comparator 18 (FIG. 1) indicates that the voltage $V_{INT}$ has just exceeded the calibration voltage $V_{EXT1}$ the number of transistors 52 that are turned on or off is held constant. The voltage level control signals supplied to control lines 54 are stored in programmable memory 14 (FIG. 1). When the user desires to configure programmable device 10 (FIG. 1) using the internally-generated programming voltage $V_{INT}$, the voltage supplied at output 50 will be properly adjusted to avoid damaging the gate oxides or junctions of the programmable transistors in programmable circuitry 22 (FIG. 1).

Calibrating the programming voltage supplied by adjustable programming voltage generators 38 compensates for any deviations in the output voltages at terminal 50 due to process-induced variations in the components of programmable device 10 (FIG. 1). To allow for the greatest possible latitude when calibrating the programming voltage, multistage charge pump 40 is preferably designed so that the nominal desired programming voltage (e.g., 13 V) is produced when half of transistors 52 are on and half of transistors 52 are off. If the actual voltage generated by multistage charge pump 40 differs from the nominal value of 13 V due to process variations, then a different number of transistors 52 can be turned on or off to adjust the programming voltage.

The foregoing is merely illustrative of the principles of this invention and various modifications can be made by those skilled in the art without departing from the scope and spirit of the invention.

What is claimed is:

1. A method for calibrating an adjustable programming voltage generator having a programming voltage output in a programmable integrated circuit device, comprising the steps of:

applying an external reference voltage to the programmable integrated circuit device;

providing voltage level control signals to the adjustable programming voltage generator; and adjusting the voltage output level of the adjustable programming voltage generator to be equal to the external reference voltage by varying the voltage level control signals.

2. The method defined in claim 1 further comprising the step of generating the programming voltage at the programming voltage output with a multistage charge pump.

3. The method defined in claim 2 wherein the adjustable programming voltage generator comprises a plurality of transistors connected in parallel between said programming voltage output and a source of ground potential, the method further comprising the step of turning on at least some of the transistors to draw current from the multistage charge pump and lower the programming voltage generated at the programming voltage output.

4. The method defined in claim 3 further comprising the step of protecting the circuitry of the adjustable programming voltage generator with at least one diode-configured current limiting transistor coupled between said programming voltage output and said plurality of transistors.

5. The method defined in claim 3 further comprising the step of supplying the programming voltage with the multistage charge pump at a nominally proper voltage level for programming the programmable circuitry by ensuring that approximately half of the plurality of transistors are on and approximately half of the plurality of said transistors are off.

6. The method defined in claim 1, wherein the programmable integrated circuit device further comprises a comparator with a first comparator input connected to the programming voltage output and a second comparator input, the method further comprising the steps of:

receiving the programming voltage with the first comparator input;

receiving the external reference voltage with the second comparator input; and generating a corresponding output signal with the comparator that is indicative of the relative magnitudes of the programming voltage and the external reference voltage.

7. The method defined in claim 1 further comprising the step of storing the voltage level control signals with a non-volatile programmable memory.

8. The method defined in claim 1, wherein the programmable integrated circuit device contains programmable transistors with floating gates, the method further comprising the step of providing a sufficient programming voltage with the adjustable programmable voltage generator to inject charge onto the floating gates of the programmable transistors.

9. The method defined in claim 1 wherein the programmable integrated circuit device comprises a programmable logic device.

10. The method defined in claim 1 wherein the programmable integrated circuit device comprises a programmable memory device.

* * * * *